(12) United States Patent
Hume et al.

(10) Patent No.: US 7,187,203 B1
(45) Date of Patent: Mar. 6, 2007

(54) CASCADABLE MEMORY

(75) Inventors: Christopher Hume, Austin, TX (US); John A. Schadt, Bethlehem, PA (US); Margaret C. Tait, Austin, TX (US); Hemanshu T. Vernenker, Austin, TX (US); Allen White, Austin, TX (US); Nhon Nguyen, Austin, TX (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 96 days.

(21) Appl. No.: 11/016,665

(22) Filed: Dec. 17, 2004

(51) Int. Cl.
*H01L 25/00* (2006.01)
*H03K 19/177* (2006.01)

(52) U.S. Cl. .............................. 326/41; 326/39; 326/47
(58) Field of Classification Search ............ 326/37–41, 326/47
See application file for complete search history.

(56) References Cited

U.S. PATENT DOCUMENTS 5,933,023 A 8/1999 Young
6,107,824 A * 8/2000 Reddy et al. .................. 326/41

OTHER PUBLICATIONS

Schadt et al., Programmable Logic Devices with Integrated Standard-Cell Logic Blocks, U.S. Appl. No. 10/391,094, filed Mar. 18, 2003.

* cited by examiner

*Primary Examiner*—Anh Q. Tran
(74) *Attorney, Agent, or Firm*—MacPherson Kwok Chen & Heid LLP; Greg J. Michelson (57) ABSTRACT

In accordance with an embodiment of the present invention, a programmable logic device includes a plurality of logic blocks, a plurality of memory blocks, and a plurality of continuation routing paths associated with the memory blocks. A plurality of continuation multiplexers, coupled to the continuation routing paths, are adapted to route signals between the memory blocks, between the logic blocks, and/or between the memory blocks and the logic blocks.

22 Claims, 9 Drawing Sheets

FIG. 4d

# CASCADABLE MEMORY

TECHNICAL FIELD

The present invention relates generally to electrical circuits and, more particularly, to memory and systems and methods for cascading memory.

BACKGROUND

Memory is widely utilized and often embedded into an integrated circuit as discrete blocks of memory that can be cascaded. There are a number of methods for cascading the memory blocks in an integrated circuit, such as for example in a programmable logic device (PLD). For example, one approach is to utilize the PLD's general purpose routing fabric to propagate memory address, data, and control signals along the memory blocks. This approach has the advantage of requiring no dedicated address bus or data bus for cascading, but severe routing congestion may occur (e.g., near the interface of the memory block and logic cells within the PLD to such an extent that routing resources for cascading may not always be available).

Another approach utilizes a dedicated address bus and data bus for the memory blocks (e.g., running along the entire length of the embedded memory row or column), with the address and data lines buffered at regular intervals (e.g., buffers with tri-state controls to allow bi-directional cascading without contention). The dedicated buses and associated circuitry for cascading, however, increase the required die area and PLD cost and may not be utilized at all if cascading is not desired. As a result, there is a need for improved techniques for cascading memory.

SUMMARY

In accordance with an embodiment of the present invention, a programmable logic device includes a plurality of logic blocks; a plurality of memory blocks; a plurality of continuation routing paths associated with the memory blocks and adapted to cascade the memory blocks; and a plurality of continuation multiplexers, coupled to the continuation routing paths, adapted to route signals between the memory blocks, between the logic blocks, and/or between the memory blocks and the logic blocks.

In accordance with another embodiment of the present invention, an integrated circuit includes logic blocks adapted to be programmed to perform a desired function of the integrated circuit; memory blocks adapted to store information within the integrated circuit, wherein each memory block is associated with at least one logic block to form an interface; means for routing signals between the memory block and the at least one logic block within the interface; and means for routing signals between the interfaces for the memory blocks or the logic blocks.

In accordance with another embodiment of the present invention, a method of providing cascadable memory within a programmable logic device includes associating a memory block with one or more logic blocks to form an interface; providing routing paths between the memory block and the one or more logic blocks in the interface; and providing routing paths to and from a first and a second side of the interface so that the memory blocks are cascadable and/or the logic blocks of different interfaces are connectable.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
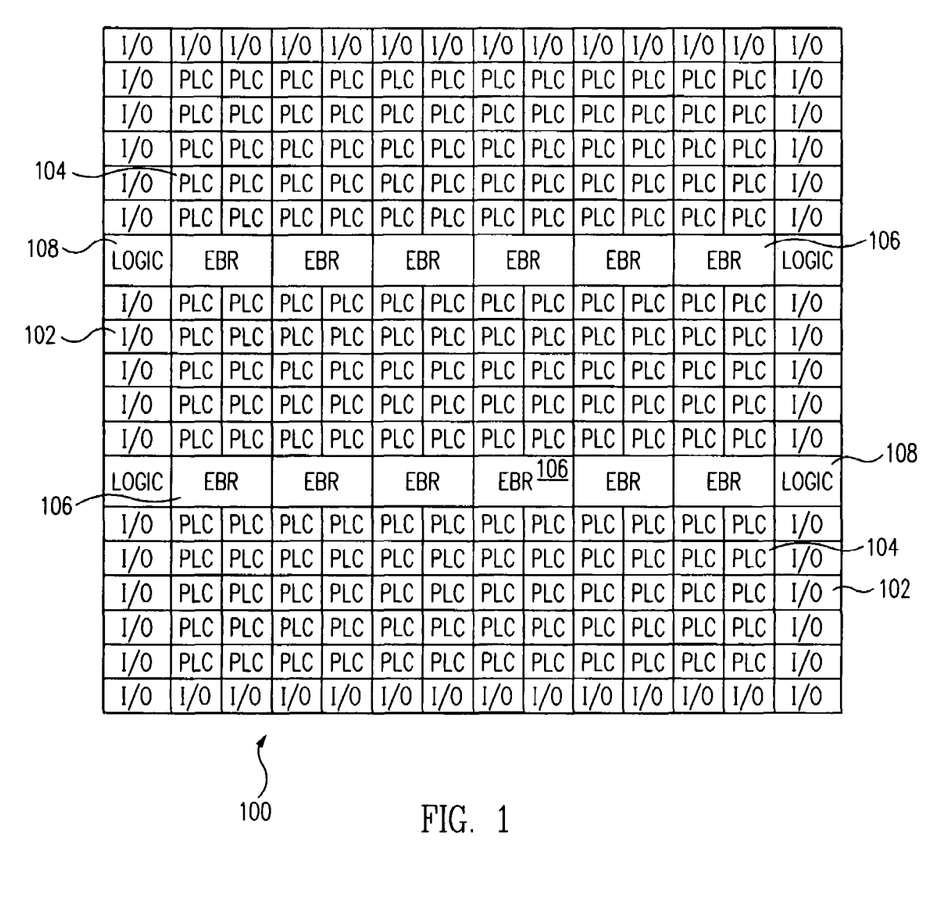
FIG. 1 shows a block diagram illustrating a programmable logic device in accordance with an embodiment of the present invention.

FIG. 1 shows a block diagram illustrating a programmable logic device (PLD) 100 in accordance with an embodiment of the present invention. PLD 100 includes a number of input/output (I/O) circuits 102, logic blocks 104 (e.g., also referred to as programmable logic blocks (PLBs) or programmable logic cells (PLCs)), memory blocks 106, and memory logic circuits 108.

I/O circuits 102 represent the input/output pads and associated I/O circuitry for PLD 100, while memory logic circuits 108 represent the logic, decoding, and associated circuitry for memory blocks 106, as would be known by one skilled in the art. Logic blocks 104 represent logic (e.g., conventional lookup tables or other types of logic or programmable logic cells (PLC)) for performing the intended functions of PLD 100.

Memory blocks 106 represent embedded memory (e.g., labeled EBR for each embedded memory block 106) within PLD 100, with the memory blocks representing any desired type of memory (e.g., embedded block RAM). As an exemplary implementation, two rows of memory blocks 106 are shown within PLD 100, but any number of rows (or columns) of memory blocks 106 and any number of memory blocks 106 in each row (or column) may be implemented in accordance with one or more embodiments of the present invention.

Furthermore, although this specific implementation shown in FIG. 1 has each memory block 106 extending across two columns of logic blocks 104, the arrangement and size of memory blocks 106 may be varied with respect to logic blocks 104. For example, each memory block 106 may fit within one column of logic blocks 104 or extend across numerous columns of logic blocks 104, depending upon the design requirements. The number of rows of logic blocks 104 above and/or below each memory block 106 may also be varied as desired.

For the specific implementation shown in FIG. 1, each memory block 106 interfaces with the two logic blocks 104 located above each memory block 106. Memory blocks 106 do not rely on a dedicated address bus or data bus for cascading memory blocks 106 as may be found with conventional PLDs. Instead, at each memory block 106/logic block 104 interface, multiplexers are utilized to provide routing paths between memory block 106 and its associated logic blocks 104.

There are also additional multiplexers (referred to herein as continuation multiplexers) and routing paths (referred to herein as continuation routing paths) to route signals between each memory block 106/logic block 104 interface and other memory block 106/logic block 104 interfaces (e.g., to the left and/or the right of each memory block 106/logic block 104 interface). These additional multiplexers and routing paths may be utilized to cascade memory blocks 106 (e.g., a waterfall routing scheme may be employed for repeatable and efficient routing) or, if memory cascading is not required, utilized as general routing paths (e.g., for logic blocks 104 or to augment any general routing structure within PLD 100).

Figure 2A:
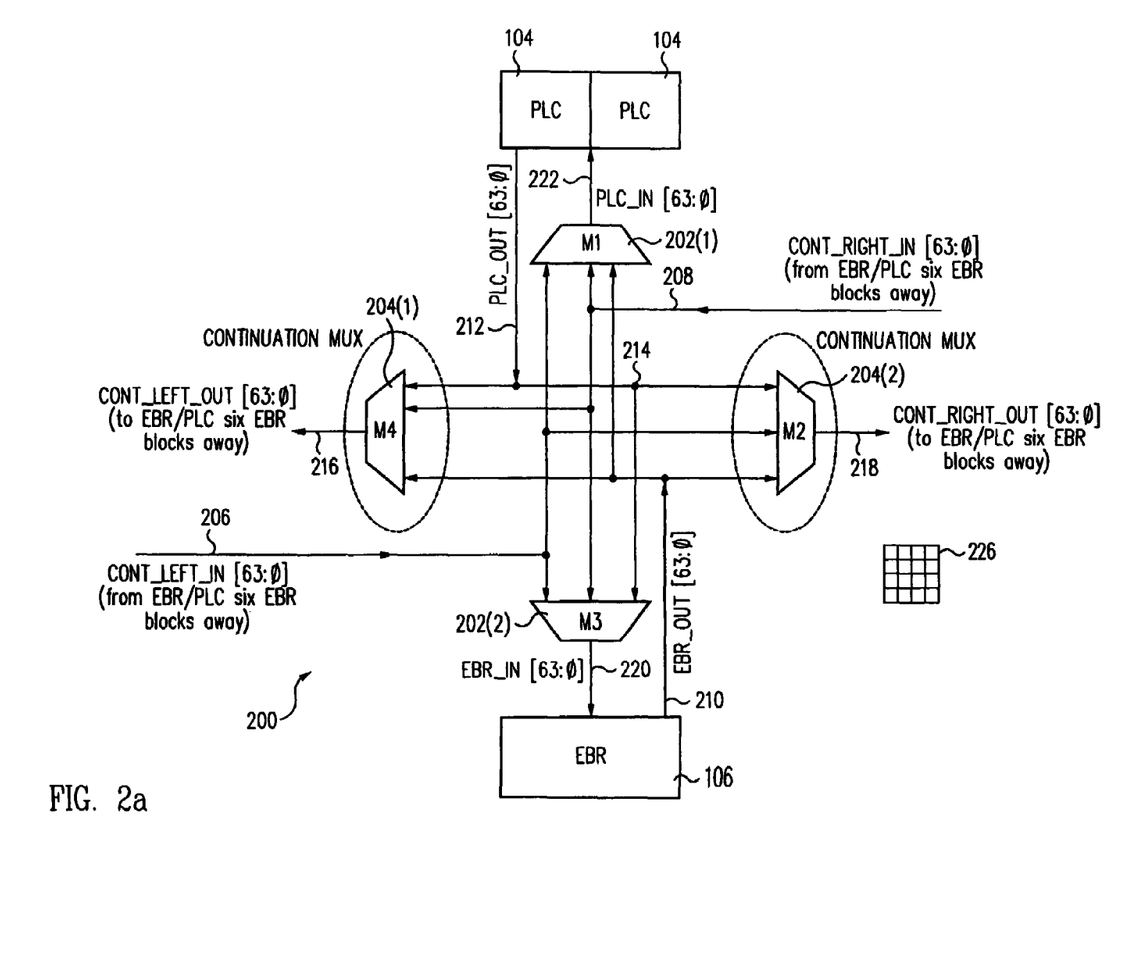
FIG. 2a shows a block diagram illustrating a multiplexer structure for the programmable logic device of FIG. 1 in accordance with an embodiment of the present invention.

For example, FIG. 2a shows a block diagram illustrating a routing architecture 200 for PLD 100 of FIG. 1 in accordance with an embodiment of the present invention. Routing architecture 200 illustrates an exemplary implementation of a multiplexer structure at an interface of one memory block 106 and two logic blocks 104. In this exemplary implementation, all of the routing paths represent buses having 64 signal lines, with circled nodes (e.g., as with a node 214) indicating a connection at the point of intersection of the routing paths. However, the number of signal lines in each routing path is not limited and may be any number desired.

Routing architecture 200 includes multiplexers 202 (which are separately referenced as multiplexers 202(1) and 202(2)) and multiplexers 204 (which are separately referenced as multiplexers 204(1) and 204(2)). Control signals to multiplexers 202 and 204 may be provided, for example, by configuration fuses 226 (e.g., programmable memory cells such as static random access memory cells or one-time programmable devices) within PLD 100.

Multiplexers 204(1) and 204(2), which may be referred to as continuation multiplexers, support cascading of memory blocks 106 and/or augment the general routing structure of PLD 100 to route any desired signal. For example, multiplexer 204(1) receives a signal line 210 (a 64 bit bus line labeled EBR_OUT [63:0]) from memory block 106, a signal line 212 (a 64 bit bus line labeled PLC_OUT [63:0]) from the two logic blocks 104, and a signal line 208 (a 64 bit bus line labeled CONT_RIGHT_IN [63:0]) that is the continuation routing path entering from the right of memory block 106. Multiplexer 204(1) provides a signal line 216 (a 64 bit bus line labeled CONT_LEFT_OUT [63:0]) that provides the continuation routing path to the left of memory block 106/logic blocks 104 interface.

Signal line 208 may originate from any number of memory blocks 106 (or logic blocks 104 or memory block 106/logic blocks 104 interfaces) from the right of memory block 106 and signal line 216 may be provided to any number of memory blocks 106 (or logic blocks 104 or memory block 106/logic blocks 104 interfaces) to the left of memory block 106 shown in FIG. 2a. For the exemplary implementation shown in FIG. 2a, signal line 208 is provided by the memory block 106/logic blocks 104 interface that is six interfaces from the right, while signal line 216 is provided to the memory block 106/logic blocks 104 interface that is six interfaces to the left from memory block 106 shown in FIG. 2a (assuming the row contains a sufficient number of the interfaces).

In a similar fashion, multiplexer 204(2) receives signal line 210, signal line 212, and a signal line 206 (a 64 bit bus line labeled CONT_LEFT_IN [63:0]) that is the continuation routing path entering from the left of memory block 106. Multiplexer 204(2) provides a signal line 218 (a 64 bit bus line labeled CONT_RIGHT_OUT [63:0]) that provides the continuation routing path to the right of memory block 106/logic blocks 104 interface. Signal line 206 may originate from any number of memory blocks 106 (or logic blocks 104 or memory block 106/logic blocks 104 interfaces) from the left of memory block 106 and signal line 218 may be provided to any number of memory blocks 106 (or logic blocks 104 or memory block 106/logic blocks 104 interfaces) to the right of memory block 106 shown in FIG. 2a. For the exemplary implementation shown in FIG. 2a, signal line 206 is provided by the memory block 106/logic blocks 104 interface that is six interfaces from the left, while signal line 218 is provided to the memory block 106/logic blocks 104 interface that is six interfaces to the right from memory block 106 shown in FIG. 2a (assuming the row contains a sufficient number of the interfaces).

If memory block 106 is not utilized or is not cascaded (e.g., utilized as a standalone memory), multiplexers 204(1) and 204(2) and their associated routing paths may still be utilized. For example, multiplexers 204(1) and 204(2) may be utilized to connect logic blocks 104 shown in FIG. 2a to other memory block 106/logic blocks 104 interfaces (not shown in FIG. 2a) or to connect memory block 106/logic blocks 104 interfaces that are to the left and the right of the memory block 106/logic blocks 104 interface shown in FIG. 2a. Thus, multiplexers 204(1) and 204(2) may be utilized to connect memory blocks 106 and/or logic blocks 104 or otherwise augment the general routing fabric.

Multiplexers 202(1) and 202(2) provide an interface between memory block 106 and two logic blocks 104 shown in FIG. 2a. Multiplexer 202(1) receives signal lines 206, 208, and 210 and provides a signal line 222 (a 64 bit bus line labeled PLC_IN [63:0]) to logic blocks 104. Multiplexer 202(2) receives signal lines 206, 208, and 212 and provides a signal line 220 (a 64 bit bus line labeled EBR_IN [63:0]) to memory block 106.

Figure 2B:
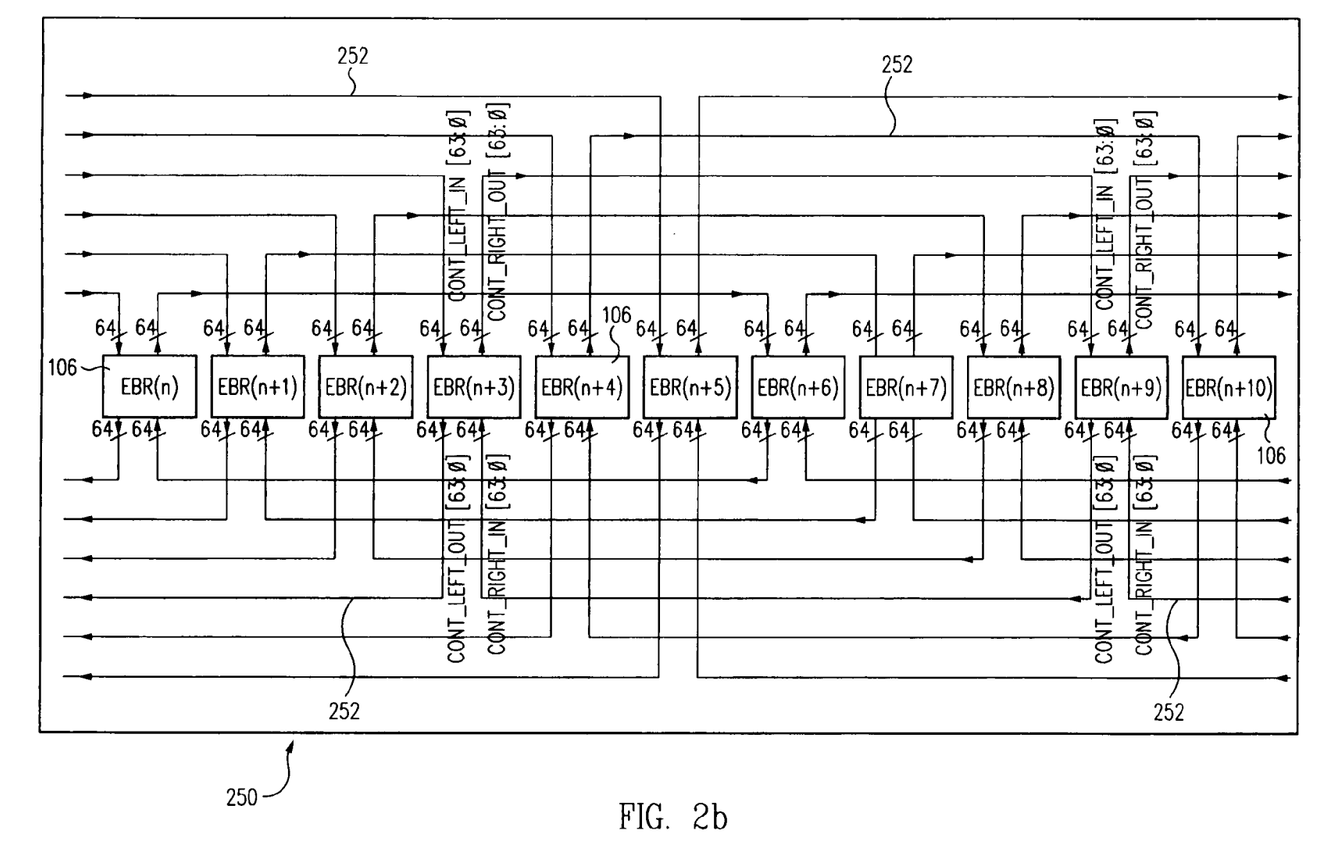
FIG. 2b shows a block diagram illustrating routing paths for the programmable logic device of FIG. 1 in accordance with an embodiment of the present invention.

FIG. 2b shows a block diagram 250 illustrating continuation routing paths 252 (i.e., signal lines 206, 208, 216, and 218) for a section of a row of memory blocks 106 within a programmable logic device (e.g., PLD 100 assuming PLD 100 includes at least this many memory blocks 106 within a row) in accordance with an embodiment of the present invention. Note that for simplicity, the routing paths between memory blocks 106 and associated logic blocks 104 at each interface are not shown.

As shown in FIG. 2b for this exemplary implementation, memory blocks 106 may be cascaded in six memory block 106 increments. Thus, continuation routing paths 252 from any memory block 106 connect to continuation routing paths 252 to any memory block 106 that is six memory blocks 106 away, with continuation routing paths 252 utilized, for example, to cascade memory blocks 106.

As a specific example as shown in FIG. 2b, the CONT_LEFT_OUT [63:0] signal of one memory block 106 (e.g., labeled EBR(n+9)) connects to the CONT_RIGHT_IN [63:0] signal of another memory block 106 (e.g., labeled EBR(n+3)) that is six memory blocks 106 to the left. Similarly, the CONT_RIGHT_OUT [63:0] signal of one memory block 106 (e.g., labeled EBR(n+3)) connects to the CONT_LEFT_IN [63:0] signal of another memory block 106 (e.g., labeled EBR(n+9)) that is six memory blocks 106 to the right. As explained herein, however, if the memory cascading feature is not required, these continuation routing paths may be employed to communicate, for example, between logic blocks 104 and/or different memory blocks 106 (e.g., for this example, memory blocks 106 that are a multiple of six memory blocks 106 apart).

Figure 3A:
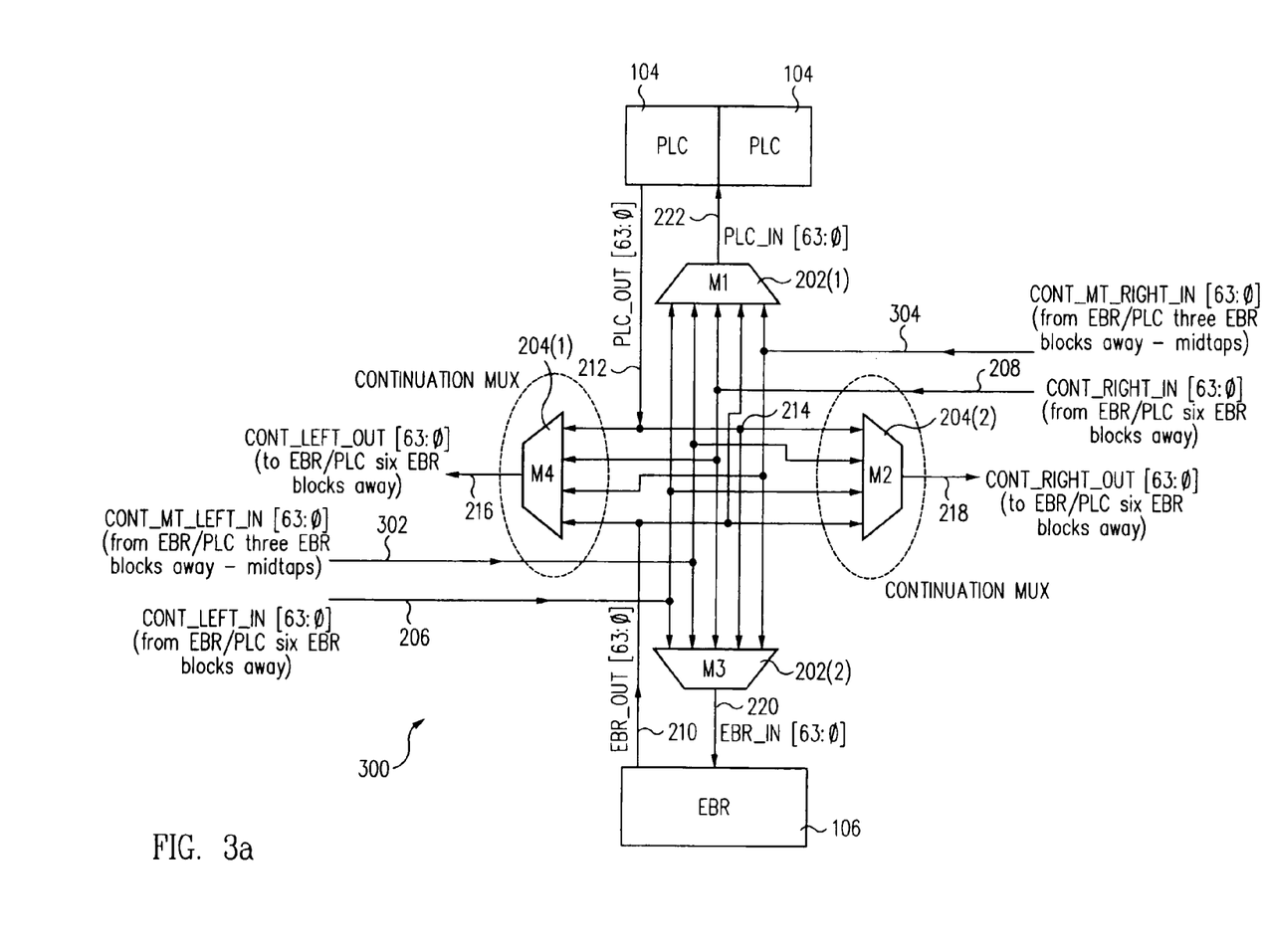
FIG. 3a shows a block diagram illustrating a multiplexer structure for the programmable logic device of FIG. 1 in accordance with an embodiment of the present invention.

FIG. 3a shows a block diagram illustrating a routing architecture 300 for PLD 100 of FIG. 1 in accordance with an embodiment of the present invention. Routing architecture 300 is similar to routing architecture 200 (FIG. 2), but includes enhanced connectivity via midtap routing paths.

Specifically, for this exemplary implementation, multiplexers 202(1) and 202(2) and 204(1) also receive a signal line 304 (a 64 bit bus line labeled CONT_MT_RIGHT_IN [63:0]) that is the midtap continuation routing path entering from the right of the row (e.g., from memory block 106/logic blocks 104 interface three interfaces away). Similarly, multiplexers 202(1) and 202(2) and 204(2) also receive a signal line 302 (a 64 bit bus line labeled CONT_MT_LEFT_IN [63:0]) that is the midtap continuation routing path entering from the left of the row (e.g., from memory block 106/logic blocks 104 interface three interfaces away). It should be understood that signal lines 302 and 304 may originate from any number of memory blocks 106 (or logic blocks 104 or memory block 106/logic blocks 104 interfaces) from the left and right, respectively, of memory block 106 shown in FIG. 3a and that any number of midtap routing paths may be added (e.g., depending upon the desired degree of connectivity and flexibility desired).

The midtap continuation routing paths (i.e., signal lines 302 and 304) provide enhanced connectivity and flexibility of routing, but require greater die area overhead due to, for example, larger multiplexers and additional routing lines and configuration fuses. For example, multiplexers 202 are 5:1 multiplexers in FIG. 3a as compared to 3:1 multiplexers in FIG. 2a without midtap routing paths, while multiplexers 204 are 4:1 multiplexers in FIG. 3a as compared to 3:1 multiplexers in FIG. 2a without midtap routing paths. As noted herein, if memory block 106 is unused or utilized as a standalone memory block 106 (i.e., not part of a cascade), the associated multiplexers 204 and continuation routing paths may be utilized to connect logic blocks 104 and/or different memory blocks 106 (e.g., for this example, memory blocks 106 that are a multiple of three or six memory blocks 106 apart) to augment the general routing fabric of the PLD.

Figure 3B:
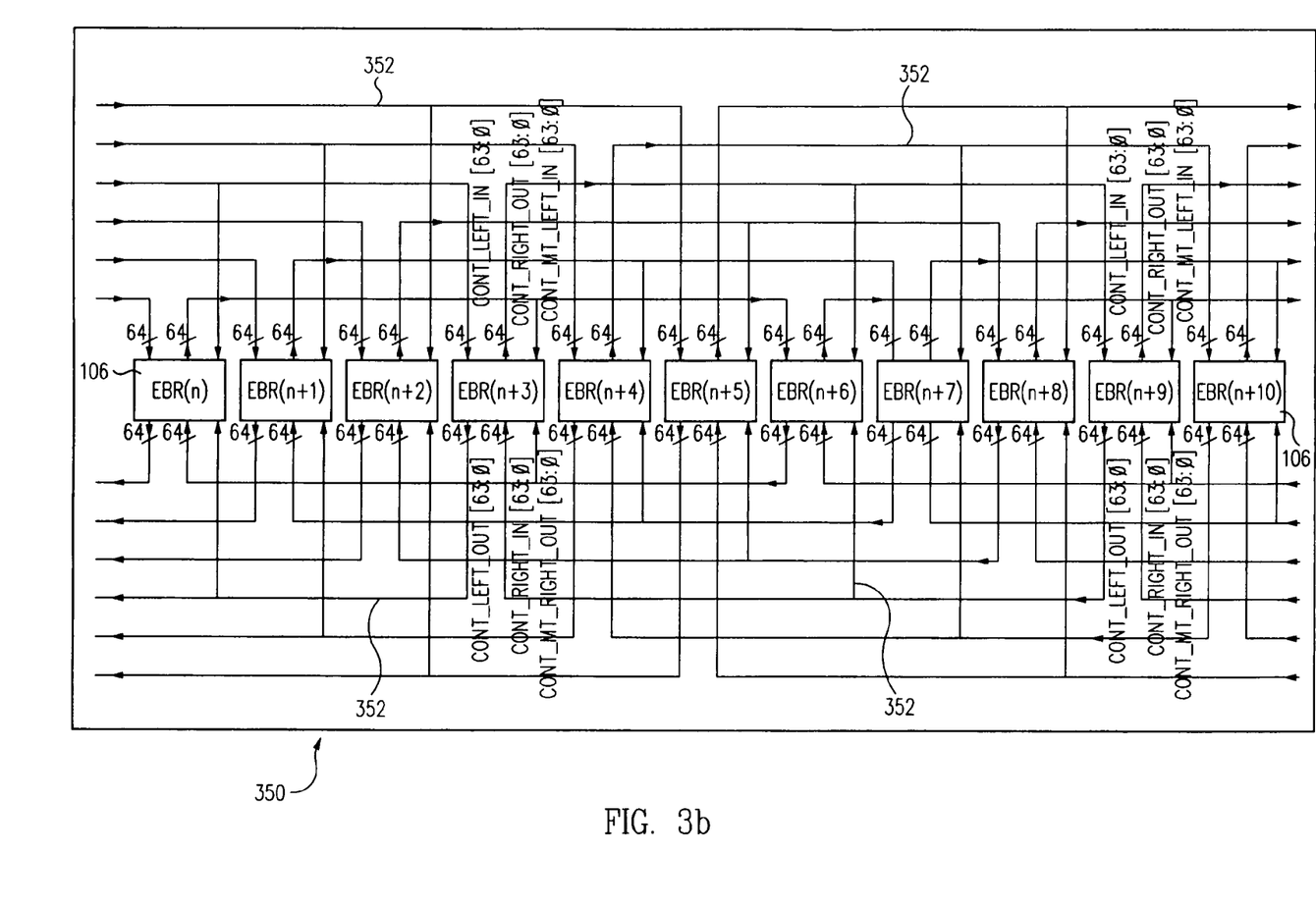
FIG. 3b shows a block diagram illustrating routing paths for the programmable logic device of FIG. 1 in accordance with an embodiment of the present invention.

FIG. 3b shows a block diagram 350 illustrating continuation routing paths 352 (i.e., signal lines 206, 208, 216, 218, 302, and 304) for a section of a row of memory blocks 106 within a programmable logic device (e.g., PLD 100 assuming PLD 100 includes at least this many memory blocks 106 within a row) in accordance with an embodiment of the present invention. Note that for simplicity, as with FIG. 2b, the routing paths between memory blocks 106 and associated logic blocks 104 at each interface are not shown.

As shown in FIG. 3b for this exemplary implementation, continuation routing paths 352 are provided with midtaps for a section of a row of memory blocks 106. Specifically as shown, memory blocks 106 may be cascaded in six memory block 106 increments, as discussed in reference to FIG. 2a, and memory blocks 106 may also be cascaded in three memory block 106 increments by utilizing the midtap continuation routing paths.

In accordance with one or more embodiments of the present invention, continuation multiplexers and associated routing paths (with or without midtaps) allow cascading of memory blocks 106. These techniques may provide certain advantages over conventional techniques. For example, the continuation multiplexers and routing paths are not dedicated to cascading memory blocks 106 and may be utilized for other purposes, when not required for cascading. The routing congestion in the general purpose routing structure of PLD 100 may be reduced, because general purpose routing is not required to route the address and data (e.g., input data needed for cascading memory blocks 106) across multiple memory blocks 106 (e.g., across a row of memory blocks 106).

Furthermore, continuation routing paths with midtap connections may be implemented as disclosed to further increase connectivity and routing flexibility. The techniques disclosed are very flexible, with the continuation routing paths utilized in various ways along a row of memory blocks 106. For example, the continuation routing paths may be utilized for cascading memory blocks 106 or may be utilized to communicate between logic blocks 104 some distance apart. The continuation routing paths allow, for example, a waterfall routing scheme to be implemented for repeatable and efficient routing.

Additionally, the continuation routing paths require minimal die area overhead (e.g., for the horizontal and vertical routing paths associated with the continuation multiplexers and routing paths). For example, these techniques may be implemented with continuation multiplexers and associated configuration fuses.

Figure 4A:
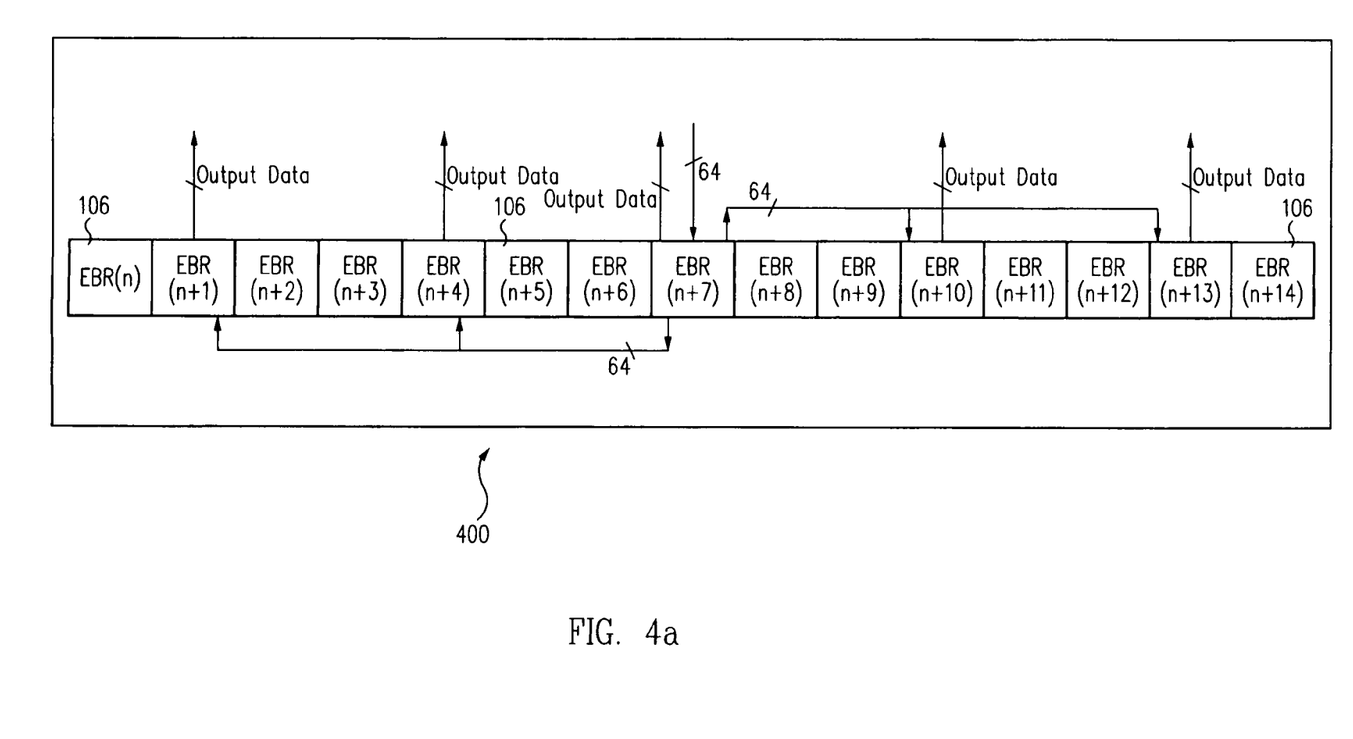
FIG. 4a shows a block diagram illustrating routing paths for the programmable logic device of FIG. 1 in accordance with an embodiment of the present invention.
Figure 4B:
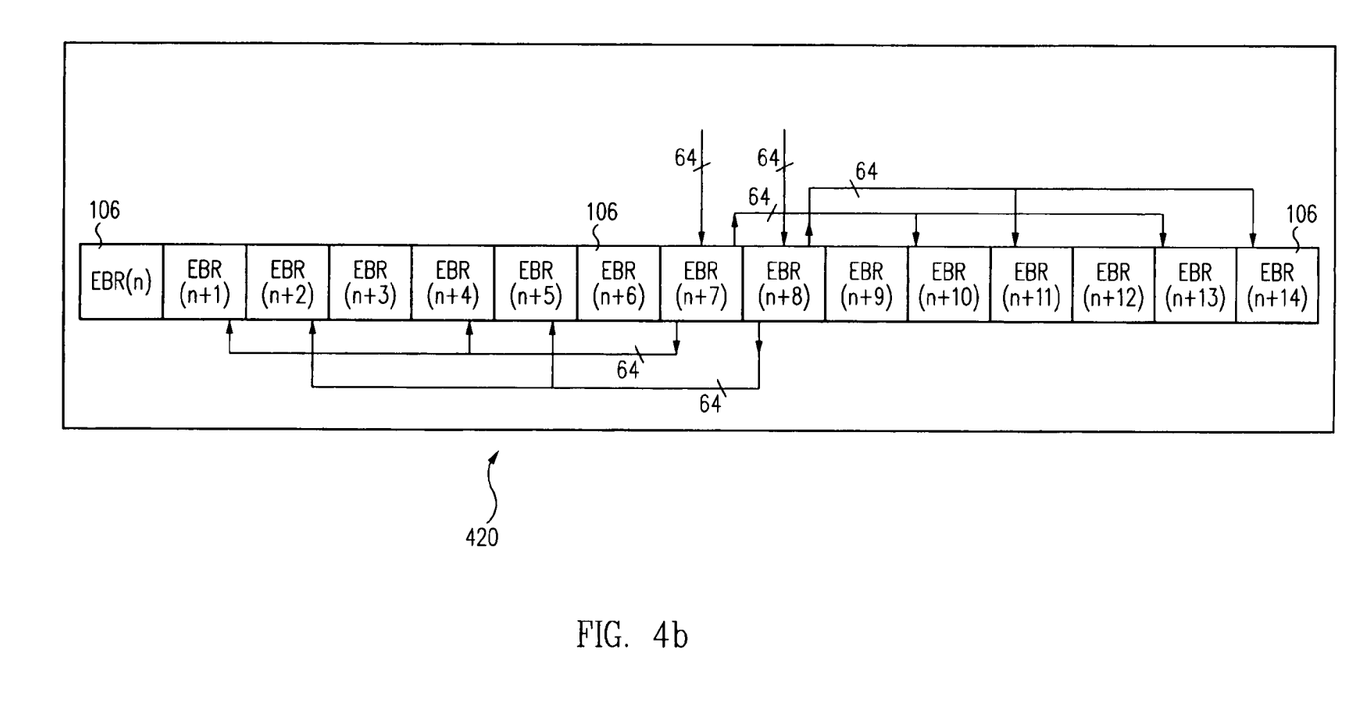
FIG. 4b shows a block diagram illustrating routing paths for the programmable logic device of FIG. 1 in accordance with an embodiment of the present invention.
Figure 4C:
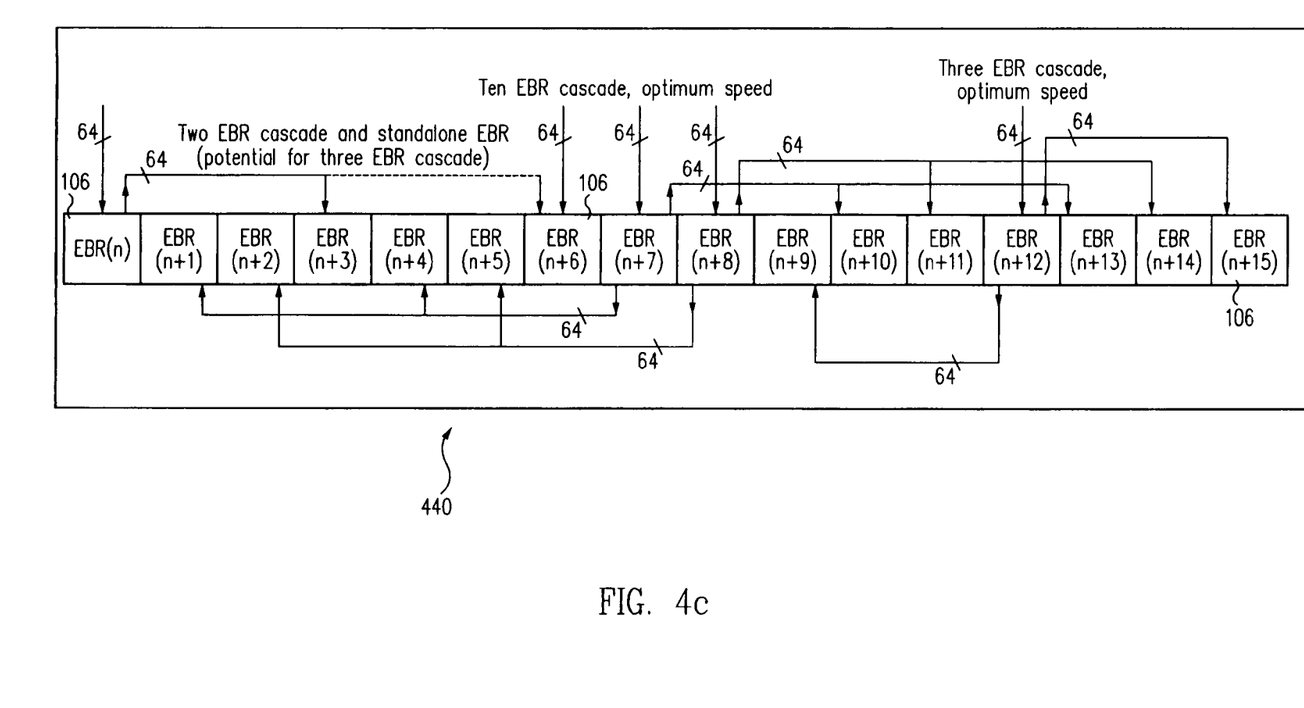
FIG. 4c shows a block diagram illustrating routing paths for the programmable logic device of FIG. 1 in accordance with an embodiment of the present invention.
Figure 4D:
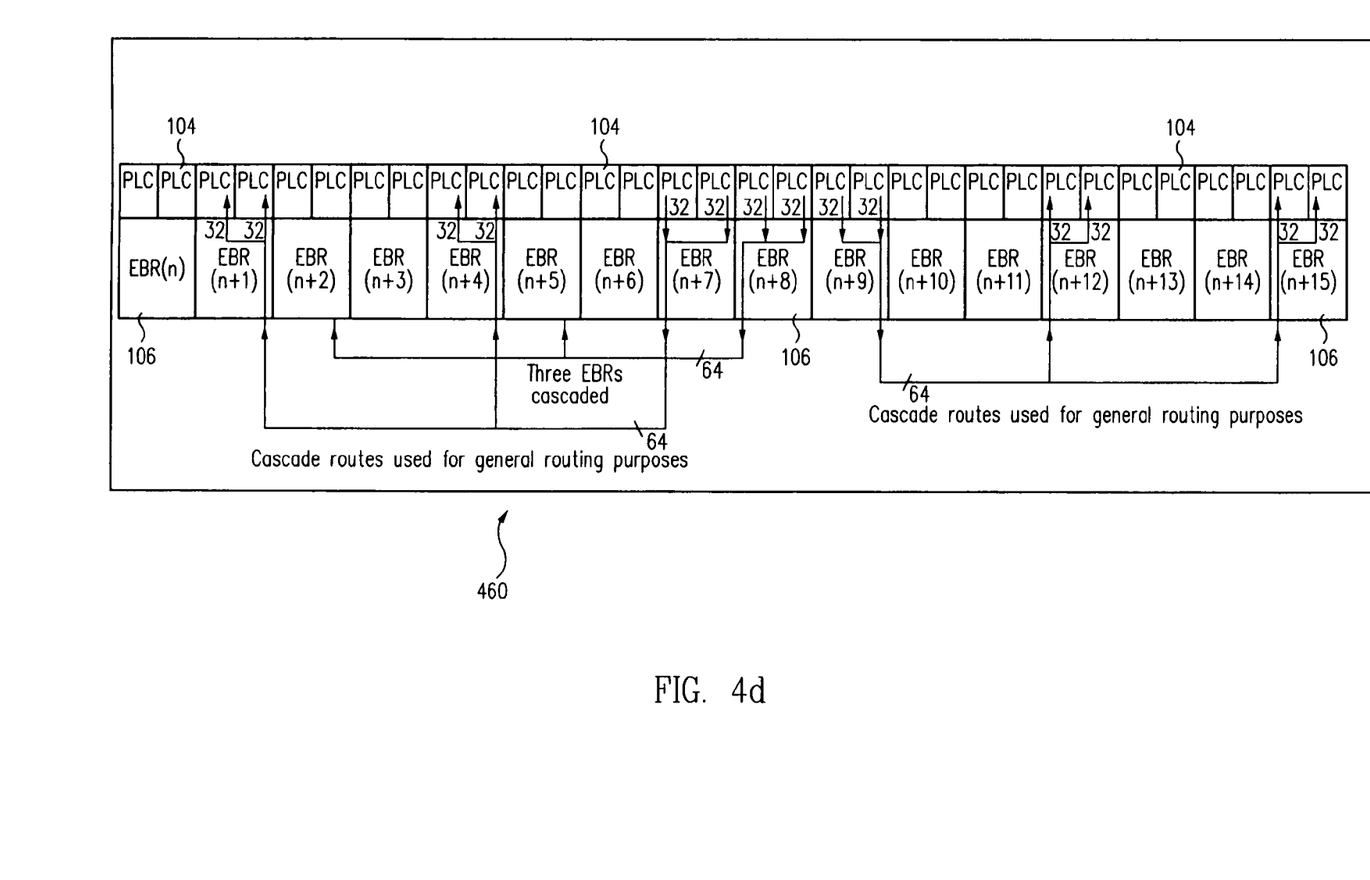
FIG. 4d shows a block diagram illustrating routing paths for the programmable logic device of FIG. 1 in accordance with an embodiment of the present invention.

FIGS. 4a through 4d provide exemplary implementation examples for utilizing continuation routing paths in accordance with one or more embodiments of the present invention. For example, FIGS. 4a through 4c illustrate examples of cascading memory blocks 106 depending, for example, upon routing resource usage and performance criteria, while FIG. 4d illustrates an example of utilizing continuation routing paths to connect logic blocks 104 (e.g., to augment the general routing fabric). It should be noted that output data lines, for simplicity, are generally not shown in FIGS. 4a through 4d.

For example, FIG. 4a shows a block diagram 400 illustrating continuation routing paths for a PLD (e.g., PLD 100 assuming PLD 100 includes sufficient memory blocks 106 within a row) in accordance with an embodiment of the present invention. Specifically, diagram 400 shows a cascade of five memory blocks 106 (labeled EBR(n+1), EBR(n+4), EBR(n+7), EBR(n+10), and EBR(n+13)) using continuation routing paths with midtaps (e.g., with minimal general routing resources required). The 64 input address, data, and/or control signals originate from logic blocks 104 (not shown) above and associated with memory block 106 (labeled EBR(n+7)), which then connect to memory blocks 106 (EBR(n+10), and EBR(n+13)) to the right and to memory blocks 106 (EBR(n+1), and EBR(n+4)) to the left via continuation routing paths with midtaps.

Without the continuation routing paths, these signals may have to be sent via the general routing fabric, which would add to the routing congestion. The output data lines from memory blocks 106, in FIG. 4a, are provided to their associated logic blocks 104 above. If a depth memory cascade is desired, logic within logic blocks 104, for example, may be utilized to select the appropriate memory block 106, as would be known by one skilled in the art.

FIG. 4b shows a block diagram 420 illustrating continuation routing paths for a PLD (e.g., PLD 100 assuming PLD 100 includes sufficient memory blocks 106 within a row) in accordance with an embodiment of the present invention. Diagram 420 illustrates a method of cascading ten memory blocks 106 (labeled EBR(n+1), EBR(n+2), EBR(n+4), EBR(n+5), EBR(n+7), EBR(n+8), EBR(n+10), EBR(n+11), EBR(n+13), and EBR(n+14)) for enhanced speed (e.g., possibly optimum speed).

To position the cascaded memory blocks 106 closer to each other (e.g., for improved performance), general routing resources are utilized to provide routing to two memory blocks 106 (EBR(n+7) and EBR(n+8)) from their associated logic blocks 104. Specifically, the address, data, and/or control signals to memory block 106 (EBR(n+7)) connect to memory blocks 106 (EBR(n+10) and EBR(n+13)) to the right and to memory blocks 106 (EBR(n+4) and EBR(n+1)) to the left via continuation routing paths with midtaps. The address, data, and/or control signals to memory block 106 (EBR(n+8)) connect to memory blocks 106 (EBR(n+11) and EBR(n+14)) to the right and to memory blocks 106 (EBR(n+5) and EBR(n+2)) to the left via continuation routing paths with midtaps.

As an alternative and potentially slower embodiment, for example for FIG. 4b, if only one general routing resource was available to provide the address, data, and/or control signals to one memory block 106 (e.g., memory block 106 labeled EBR(n+7)), the memory blocks 106 in the cascade may be memory block 106 (EBR(n+7)) in the center, with memory blocks 106 (EBR(n+10), EBR(n+13), EBR(n+16), EBR(n+19), and EBR(n+22)) to the right and memory blocks 106 (EBR(n+4), EBR(n+1), EBR(n−2), and EBR(n−5)) to the left (with some of referenced memory blocks 106 not shown in the partial row illustrated in FIG. 4b).

FIG. 4c shows a block diagram 440 illustrating continuation routing paths for a PLD (e.g., PLD 100 assuming PLD 100 includes sufficient memory blocks 106 within a row) in accordance with an embodiment of the present invention. Diagram 440 illustrates an exemplary method of multiple, separate memory block 106 cascades within the same row. For example, a ten memory block 106 cascade is formed in a similar manner as that shown in FIG. 4(b) by utilizing memory blocks 106 (labeled EBR(n+1), EBR(n+2), EBR(n+4), EBR(n+5), EBR(n+7), EBR(n+8), EBR(n+10), EBR(n+11), EBR(n+13), and EBR(n+14)).

Furthermore, concurrently, a three memory block 106 cascade may be formed by utilizing memory blocks 106 (labeled EBR(n+12), EBR(n+9), and EBR(n+15)) and a two memory block 106 cascade may be formed by utilizing memory blocks 106 (labeled EBR(n) and EBR(n+3)). Additionally, memory block 106 (labeled EBR(n+6)) may be configured as a standalone memory block 106, but the dotted line in FIG. 4c drawn to memory block 106 (EBR(n+6)) illustrates that memory block 106 (EBR(n+6)) may be cascaded with memory block 106 (EBR(n) and EBR(n+3)), if a three memory block 106 cascade is desired instead of a two memory block 106 cascade and a single memory block 106.

FIG. 4d shows a block diagram 460 illustrating continuation routing paths for a PLD (e.g., PLD 100 assuming PLD 100 includes sufficient memory blocks 106 within a row) in accordance with an embodiment of the present invention. Diagram 460 illustrates that the continuation routing paths may be utilized to augment the general purpose routing, when the continuation routing paths are not utilized to cascade memory blocks 106.

In the specific exemplary implementation of FIG. 4d, the continuation routing paths are utilized to cascade certain ones of memory blocks 106 and to connect certain ones of logic blocks 104 (e.g., to augment the general purpose routing architecture) along a row of memory blocks 106. Specifically, memory blocks 106 (labeled EBR(n+8), EBR(n+5), and EBR(n+2)) form a three memory block 106 cascade, while the continuation routing paths augment general routing resources to connect logic blocks 104 above certain ones of memory blocks 106 (i.e., above memory blocks 106 labeled EBR(n+1), EBR(n+4), and EBR(n+7)) and also to connect logic blocks 104 above certain other ones of memory blocks 106 (i.e., above memory blocks 106 labeled EBR(n+9), EBR(n+12), and EBR(n+15)). Thus, as illustrated in an exemplary fashion in FIG. 4d, if continuation routing paths are not utilized for cascading memory blocks 106, then the continuation routing paths may be utilized to communicate between different logic blocks 104 and/or memory blocks 106.

Systems and methods are disclosed herein to provide cascadable embedded memory. For example, in accordance with an embodiment of the present invention, a method of cascading embedded memory blocks in a programmable logic device, such as a field programmable gate array (FPGA), is disclosed that utilizes continuation multiplexers for routing the various signals. The method allows the memory blocks, for example, to be configured in different widths, depths, and modes.

In contrast to some conventional techniques, the memory blocks may be cascaded without requiring multiplexers and routing paths that are dedicated to cascading the memory blocks. For example, if the memory blocks do not need to be cascaded, the multiplexer and routing paths may be utilized for other features (e.g., for general purpose routing, such as between logic blocks and/or the memory blocks).

Embodiments described above illustrate but do not limit the invention. It should also be understood that numerous modifications and variations are possible in accordance with the principles of the present invention. Accordingly, the scope of the invention is defined only by the following claims.

We claim:

1. A programmable logic device comprising:
    a plurality of logic blocks;
    a plurality of memory blocks;
    a plurality of continuation routing paths associated with the memory blocks and adapted to cascade the memory blocks; and
    a plurality of continuation multiplexers, coupled to the continuation routing paths, adapted to route signals between the memory blocks, between the logic blocks, and/or between the memory blocks and the logic blocks, wherein the continuation routing paths further comprise midtap routing paths.

2. The programmable logic device of claim 1, further comprising a plurality of first multiplexers, coupled to the continuation routing paths, adapted to route signals between the memory blocks and the logic blocks.

3. The programmable logic device of claim 2, further comprising configuration fuses, wherein the plurality of first multiplexers and the plurality of continuation multiplexers are configured via the configuration fuses.

4. The programmable logic device of claim 1, wherein each of the memory blocks forms an interface with at least one adjacent logic block, and wherein each of the continuation routing paths, which are separate from a general routing structure of the programmable logic device, provides a path between a first and a second interface with at least one other interface disposed between the first and second interfaces.

5. The programmable logic device of claim 1, further comprising input/output circuits adapted to route signals into and out of the programmable logic device.

6. The programmable logic device of claim 1, wherein the continuation routing paths are adapted to augment a general routing structure of the programmable logic device.

7. The programmable logic device of claim 1, wherein the memory blocks are cascadable at certain intervals via the continuation multiplexers and the continuation routing paths.

8. The programmable logic device of claim 2, wherein each of the memory blocks is associated with one or more of the logic blocks to form an interface, wherein the interface further comprises at least two of the first multiplexers to route signals between the memory block and the one or more of the logic blocks of the interface or to receive signals from the continuation routing paths or provide signals on the continuation routing paths via the continuation multiplexers.

9. The programmable logic device of claim 8, wherein the interface further comprises at least two of the continuation multiplexers adapted to receive signals from the memory block or the one or more of the logic blocks of the interface or from the continuation routing paths and to provide signals on the continuation routing paths.

10. The programmable logic device of claim 8, wherein the interface further comprises at least two of the continuation multiplexers adapted to receive signals from the memory block or the one or more of the logic blocks of the interface or from the continuation routing paths and to provide signals on the continuation routing paths, with one of the continuation multiplexers receiving signals entering the interface from one side of the interface and another of the continuation multiplexers receiving signals entering the interface from another side of the interface.

11. An integrated circuit comprising:
logic blocks adapted to be programmed to perform a desired function of the integrated circuit;
memory blocks adapted to store information within the integrated circuit, wherein each memory block is associated with at least one logic block to form an interface;
means for routing signals between the memory block and the at least one logic block within the interface; and
means for routing signals between the interfaces for the memory blocks or the logic blocks, wherein the means for routing signals between the interfaces provides for each of the interfaces at least a first and a second path to corresponding first and second interfaces, with the first and second paths spanning but not connectable to at least one other interface disposed between the associated interface and the first and second interfaces.

12. The integrated circuit of claim 11, wherein the means for routing signals between the interfaces for the memory blocks or the logic blocks is adapted to be separate from and augment a general routing structure of the integrated circuit.

13. The integrated circuit of claim 11, wherein the memory blocks are cascadable at certain intervals via the means for routing signals between the interfaces.

14. The integrated circuit of claim 11, wherein the means for routing signals between the memory block and the at least one logic block within the interface comprises a pair of multiplexers.

15. The integrated circuit of claim 11, wherein the means for routing signals between the interfaces comprises a pair of multiplexers.

16. The integrated circuit of claim 15, wherein the multiplexers receive signals from the at least one logic block and the memory block in the interface, with one of the multiplexers also receiving a first signal from a first side of the interface and providing the first signal to a second one of the interfaces, while the other one of the multiplexers receives a second signal from the second side of the interface and provides the second signal to a third one of the interfaces.

17. A method of providing cascadable memory within a programmable logic device, the method comprising:
associating a memory block with one or more logic blocks to form an interface;
providing routing paths between the memory block and the one or more logic blocks in the interface; and
providing continuation routing paths for the interfaces so that the memory blocks are cascadable and/or the logic blocks of different interfaces are connectable, wherein each of the continuation routing paths provides a path only between a first and a second interface with at least one other interface disposed between the first and second interfaces.

18. The method of claim 17, wherein the continuation routing paths are separate from and adapted to augment a general routing structure of the programmable logic device.

19. The method of claim 17, wherein the memory blocks are cascadable at certain intervals between the interfaces to form a waterfall routing scheme.

20. The method of claim 17, further comprising configuring the routing paths and the continuation routing paths via configuration fuses.

21. The integrated circuit of claim 11, wherein the means for routing signals between the interfaces further comprises providing midtap routing paths.

22. The method of claim 17, further comprising providing midtap routing paths.

* * * * *